(12) United States Patent
Nakata et al.

(10) Patent No.: US 6,927,099 B2
(45) Date of Patent: Aug. 9, 2005

(54) PROCESS FOR PRODUCING SEMICONDUCTOR DEVICE AND SEMICONDUCTOR DEVICE

(75) Inventors: Yasukazu Nakata, Matsudo (JP); Masateru Yamakage, Matsudo (JP); Naoki Hasegawa, Kamihukuoka (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/871,290

(22) Filed: Jun. 17, 2004

(65) Prior Publication Data

US 2005/0009241 A1 Jan. 13, 2005

(30) Foreign Application Priority Data

Jul. 8, 2003 (JP) ......................................... 2003-271844

(51) Int. Cl.⁷ ............................................... H01L 21/44
(52) U.S. Cl. ........................... 438/126; 438/15; 438/17; 438/108; 438/613; 438/118
(58) Field of Search ........................... 438/126, 15, 17, 438/108, 613, 118; 257/787, 788, 783, 789, 778, 782

(56) References Cited

U.S. PATENT DOCUMENTS 5,864,178 A * 1/1999 Yamada et al. ............. 257/737
6,100,597 A * 8/2000 Nakamura ................... 257/787
6,225,704 B1 * 5/2001 Sumita et al. ............... 257/789
6,437,450 B1 * 8/2002 Baba et al. .................. 257/778
6,589,802 B1 * 7/2003 Asada et al. .................. 438/15

FOREIGN PATENT DOCUMENTS

JP                10340927 A   * 12/1998   ........... H01L/21/60

* cited by examiner

*Primary Examiner*—David Zarneke
*Assistant Examiner*—Igwe U. Anya
(74) *Attorney, Agent, or Firm*—Frishauf, Holtz, Goodman & Chick, P.C.

(57) ABSTRACT

A process for producing a semiconductor device which comprises, in a process comprising mounting a semiconductor element in accordance with a flip chip bonding process, bonding the semiconductor element to a circuit board with a thermosetting resin, coating peripheral portions of the bonded semiconductor element with a photocurable resin and forming a fillet by photocuring the photocurable resin; and a semiconductor device comprising a semiconductor element mounted on a circuit board in accordance with a flip chip bonding process, wherein the semiconductor element is bonded to the circuit board with a thermosetting resin at portions directly under the semiconductor element, and a fillet is formed with a photocurable resin at peripheral portions of the semiconductor element. The semiconductor device can be efficiently produced in accordance with the flip chip bonding process and exhibits excellent resistance to heat and moisture and reliability.

13 Claims, 2 Drawing Sheets

PRIOR ART

PROCESS FOR PRODUCING SEMICONDUCTOR DEVICE AND SEMICONDUCTOR DEVICE

BACKGROUND OF THE INVENTION

1. Field of the Invention

The present invention relates to a process for producing a semiconductor device and a semiconductor device. More particularly, the present invention relates to a process for efficiently producing a semiconductor device exhibiting excellent resistance to heat and moisture and reliability in accordance with the flip chip bonding process and a semiconductor device produced in accordance with the process.

2. Description of Related Art

Electronic products using semiconductor devices such as IC and LSI are always required to become smaller and lighter and to exhibit more excellent performance in all areas including consumer appliances and industrial instruments. Therefore, semiconductor devices produced in accordance with the flip chip bonding process in which bare chips are directly mounted are becoming major products to replace semiconductor devices produced by bonding semiconductor elements to leads with bonding wires, followed by molding the obtained products with epoxy resins or ceramics.

FIG. 1 shows a sectional view of an example of a semiconductor device having a semiconductor element mounted in accordance with the flip chip bonding process. An electrode 2 on a circuit board 1 faces an electrode 4 of a semiconductor element 3 via a bump 5 on the semiconductor element 3. The semiconductor element 3 is bonded to the circuit board 1 with an anisotropically conductive thermosetting adhesive 6 so that the bump 5 and the electrode 2 which face each other are electrically connected and the electric insulation between unnecessary electrodes is achieved. The anisotropically conductive thermosetting adhesive 6 extends into the peripheral portions of the semiconductor element and forms a fillet 7. Due to the fillet 7 formed at the peripheral portions of the semiconductor element 3, infiltration of oxygen and water into the inner portions of the thermoset anisotropically conductive adhesive is prevented. Thus, the semiconductor element is protected, and strength such as impact strength of the semiconductor device is improved due to the increase in the area of bonding between the semiconductor element and the circuit board.

To bond the semiconductor element and the circuit board to each other and to form the fillet in the peripheral portions of the semiconductor element, a liquid thermosetting adhesive is placed on the circuit board as drops in an amount corresponding to the combined amounts of the underfill directly under the semiconductor element and the fillet formed in the peripheral portion of the semiconductor element, the semiconductor element is placed on the circuit board at the prescribed position, a pressure is applied to the semiconductor device so that the thermosetting adhesive in an amount for forming the fillet is forced out, and the thermosetting adhesive is cured by heating the semiconductor element. The thermosetting adhesive in the underfill portion can be cured within 10 seconds since heat is transferred through the semiconductor element. However, it takes time to cure the thermosetting adhesive in the fillet portion since heat is not directly transferred to this portion. This causes a problem in that the productivity in the production of the semiconductor device is not improved.

Photocurable thermosetting resins which can be cured by any of heat and light are developed as the resin for producing semiconductor devices. When these resins are used, the resin in the portion directly under the semiconductor element can be cured by heating, and the uncured resin in the fillet portion can be cured by irradiation of light, thereafter. However, the resins heretofore developed have problems in that the reaction temperature is raised to 300° C., that there is the possibility that the reaction starts in the syringe due to the high reactivity, and that there is the possibility that corrosion of the circuit takes place since the catalyst is strongly acidic.

SUMMARY OF THE INVENTION

The present invention has an object of providing a process for efficiently producing a semiconductor device exhibiting excellent resistance to heat and moisture and reliability in accordance with the flip chip bonding process and a semiconductor device produced in accordance with the process.

As the result of intensive studies by the present inventors to overcome the above problems, it was found that a semiconductor device exhibiting excellent resistance to heat and moisture and reliability could be efficiently produced in accordance with the flip chip bonding process in a short time when a semiconductor element was bonded to a circuit board with a thermosetting resin, and a fillet is formed by applying a photocurable resin to peripheral portions of the bonded semiconductor element, thereafter. The present invention has been completed based on this knowledge.

The present invention provides:

(1) A process for producing a semiconductor device which comprises, in a process comprising mounting a semiconductor element in accordance with a flip chip bonding process, bonding the semiconductor element to a circuit board with a thermosetting resin, coating peripheral portions of the bonded semiconductor element with a photocurable resin and forming a fillet by photocuring the photocurable resin; and (2) A semiconductor device comprising a semiconductor element mounted on a circuit board in accordance with a flip chip bonding process, wherein the semiconductor element is bonded to the circuit board with a thermosetting resin at portions directly under the semiconductor element, and a fillet is formed with a photocurable resin at peripheral portions of the semiconductor element.

Figure 1:
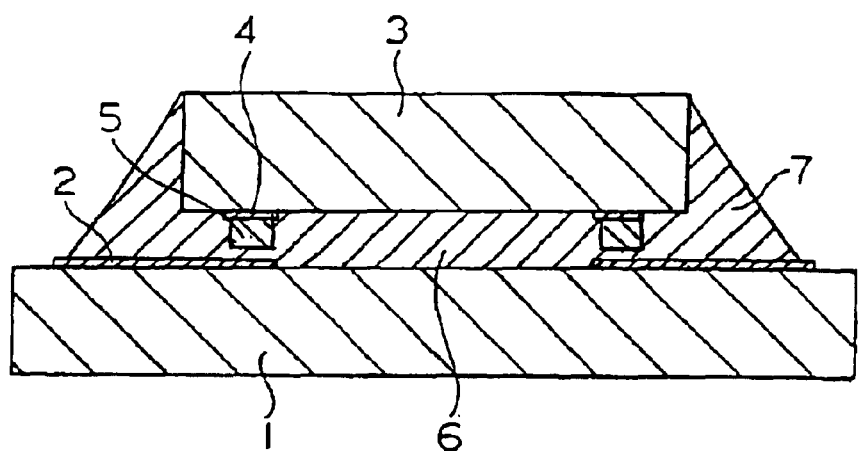
FIG. 1 shows a sectional view of an example of the semiconductor device.

The numbers in the figures have the meanings as listed in the following:

| | |
|---|---|
| 1 | A circuit board |
| 2 | An electrode |
| 3 | A semiconductor element |
| 4 | An electrode |
| 5 | A bump |
| 6 | An anisotropically conductive adhesive |
| 7 | A fillet |
| 8 | A thermosetting resin |
| 9 | A photocurable resin |

DESCRIPTION OF THE PREFERRED EMBODIMENTS

The process for producing a semiconductor device of the present invention comprises, in a process comprising mounting a semiconductor element in accordance with a flip chip bonding process, bonding the semiconductor element to a circuit board with a thermosetting resin, coating peripheral portions of the bonded semiconductor element with a photocurable resin and forming a fillet by photocuring the photocurable resin.

In the mounting of a semiconductor element in accordance with the flip chip bonding process, a bare semiconductor element which is not packaged, i.e., a bare chip, is used for the mounting, and electrodes on the functional face of the semiconductor element are connected to electrodes on the circuit board. In accordance with the flip chip bonding process, the area occupied by the mounting and the height of the mounting can be decreased, and the obtained instrument can be made smaller and thinner. Moreover, the length of the connection between the terminals of the electrodes can be made shorter than that in accordance with the wire bonding process, and the loss in the high frequency signals can be decreased.

In the process of the present invention, the process for bonding the semiconductor element to the circuit board with the thermosetting resin is not particularly limited. Examples of the process include the process in which an anisotropically conductive adhesive paste (ACP) is used, the process in which an anisotropically conductive adhesive film (ACF) is used, the process in which a non-conductive adhesive paste (NCP) is used, the process in which non-conductive adhesive film (NCF) is used, the epoxy encapsulated solder connection process (ESC), the controlled collapse chip connection process (C4) and the ultrasonic flip chip bonding process.

The anisotropically conductive adhesive paste is an adhesive of the liquid form or the paste form containing conductive particles dispersed in a thermosetting resin. The anisotropically conductive adhesive paste is placed on the circuit board as drops or applied to coat the circuit board, and the thermosetting resin is cured when the semiconductor element is pressed and heated by a head of a flip chip mounting machine. Thus, the bonding between the circuit board and the semiconductor element, the electric connection between the electrodes faced to each other and the electric insulation between adjacent electrodes are achieved simultaneously. In the process of the present invention, it is preferable that the amount of the anisotropically conductive adhesive paste placed on the circuit board as drops or applied to coat the circuit board is adjusted so that the portion directly under the semiconductor element is completely filled with the thermosetting resin and the thermosetting resin does not extend into the outside portions of the semiconductor element.

The anisotropically conductive adhesive film is a film formed from a thermosetting resin comprising conductive particles and, in general, both sides are laminated with a cover film and a release film. The anisotropically conductive adhesive film is cut into a prescribed size and placed on the circuit board after the cover film is removed, and the semiconductor element is placed on top of the film after the release film is removed. The thermosetting resin is cured when the semiconductor element is pressed and heated by a head of a flip chip mounting machine, and the bonding between the circuit board and the semiconductor element, the electric connection between the electrodes faced to each other and the electric insulation between adjacent electrodes are achieved simultaneously. In the process of the present invention, it is preferable that the shape and the size of the anisotropically conductive adhesive film are adjusted to the same as those of the semiconductor element so that the portion directly under the semiconductor element is completely filled with the thermosetting resin and the thermosetting resin does not extend into the outside portions of the semiconductor element.

Examples of the conductive particle comprised in the anisotropically conductive adhesive paste or the anisotropically conductive adhesive film include particles of metals such as nickel, silver and gold, particles of resins plated with these metals, particles of glass and particles of ceramics. Examples of the thermosetting resin forming the anisotropically conductive adhesive paste or the anisotropically conductive adhesive film include epoxy resins, polyimide resins and urethane-acrylate resins.

In the process using the non-conductive adhesive paste or the non-conductive adhesive film, the semiconductor element and the circuit board are bonded to each other via the non-conductive adhesive paste or the non-conductive adhesive film. The paste or the film is pressed between the semiconductor element and the circuit board, and a condition that electric current can flow between the corresponding electrodes (bumps) but cannot flow between unnecessary electrodes, is achieved. Then, the thermosetting resin in the non-conductive adhesive paste or the non-conductive adhesive film is cured. In the process using the non-conductive adhesive paste or the non-conductive adhesive film, it is preferable that the portion directly under the semiconductor element is completely filled with the thermosetting resin and the thermosetting resin does not extend into the outside portions of the semiconductor element.

In the ESC process, the circuit board is coated with the thermosetting resin. The metal bonding is formed between bumps of the gold wire formed to the shape of the electrode on the functional face of the semiconductor element and solder precoats formed on the electrode of the circuit board, and the thermosetting resin is cured.

In the C4 process, bumps of a high melting solder formed on the electrode on the functional face of the semiconductor element and bumps of a cocrystalline solder formed on the electrode of the circuit board are bonded together with melting. Then, the portion directly under the semiconductor element is filled with a thermosetting underfill resin, and the resin is cured.

In the ultrasonic flip chip bonding process, bumps of a gold wire formed on the electrode on the functional face of the semiconductor element are brought into contact with the gold electrode on the circuit board, and the metals are bonded to each other by applying ultrasonic vibration in the direction parallel with the face of the circuit board under a pressure. Then, the portion directly under the semiconductor element is filled with a thermosetting underfill resin, and the resin is cured.

In the ESC process, the C4 process and the ultrasonic flip chip bonding process, although the metal bonding is formed between the electrodes, the semiconductor element can be regarded to be bonded to the circuit board with the thermosetting resin in these processes since the portion directly under the semiconductor element is filled with the cured thermosetting resin. In these processes, it is preferable that the portion directly under the semiconductor element is filled with the thermosetting resin and the thermosetting resin does not extend into the outside portions of the semiconductor element.

In the process of the present invention, after the semiconductor element is bonded to the circuit board with the thermosetting resin, a photocurable resin is applied to the peripheral portions of the semiconductor element and cured by irradiation with light, and a fillet is formed. The photocurable resin comprises a polymerizable prepolymer and a photopolymerization initiator as the essential components and, where necessary, reactive diluents, crosslinking monomers, crosslinking prepolymers and other resins. In the process of the present invention, any of photocurable resins of the radical polymerization type and photocurable resins of the cationic polymerization type can be used.

Examples of the photopolymerization initiator for the radical polymerization include benzoin, benzoin ethyl ether, acetophenone, dimethylaminoacetophenone, 1-hydroxycyclohexyl ketone, benzophenone, p-phenylbenzophenone, dichlorobenzophenone, 2-methylanthraquinone, 2-aminoanthraquinone, 2-ethylthioxanthone and benzyl dimethyl ketal. Examples of the polymerizable prepolymer for the radical polymerization include urethane (meth)acrylates, polyester (meth)acrylates, polyether (meth)acrylates, epoxy (meth)acrylates and poly (meth)acrylic esters having the carbon-carbon double bond on the side chains.

Examples of the photopolymerization initiator for the cationic polymerization include compounds having combinations of onium ions such as aromatic sulfonium ions, aromatic oxosulfonium ions, aromatic diazonium ions and aromatic iodonium ions and anions such as tetrafluoroborate anion, hexafluorophosphate anion, hexafluoro-antimonate anion and hexafluoroarsenate anion. Specific examples of the above compounds include p-methoxybenzenediazonium hexafluorophosphate, diphenyliodonium hexafluorophosphate and triphenylsulfonium hexafluoroantimonate. Examples of the polymerizable prepolymer for the cationic polymerization include polyether glycidyls, polyester glycidyls, cyclic aliphatic epoxy resins, heterocyclic epoxy resins, epoxy resins of the novolak type, epoxy resins of the bisphenol A type, epoxy resins of the bisphenol AD type, poly(meth)acrylic esters having glycidyl group on the side chains.

Examples of the reactive diluent include cyclohexyl (meth)acrylate, 2-ethylhexyl (meth)acrylate, lauryl (meth) acrylate, stearyl (meth)acrylate, N-hydroxyethyl (meth) acrylamide, N-vinylacetamide and compounds obtained by hydrogenation of the nucleus of bisphenol A diglycidyl ether. Examples of the crosslinking monomer include 1,4-butanediol di(meth)acrylate, noepentyl glycol di(meth) acrylate and pentaerythritol tri(meth)acrylate. Examples of the crosslinking prepolymer include polyethylene glycol di(meth)acrylate, polypropylene glycol di(meth)acrylate and novolak polyglycidyl ether. Examples of the other resin include polyurethanes, polyesters, polyamides, polyimides, polycarbonates, phenol resins, urea resins and melamine resins.

In the process of the present invention, the process for coating the peripheral portions of the semiconductor element with the photocurable resin is not particularly limited. For example, when the semiconductor element has a small size, the photocurable resin can be applied uniformly to the four sides of the semiconductor element by supplying the liquid photocurable resin to a point on a side of the semiconductor element by a dispenser or the like. When the semiconductor element has a large size, the liquid photocurable resin can be supplied to the four sides of the semiconductor element while the dispenser or the like is moved. In the process of the present invention, the fillet composed of the photocurable resin alone can be formed in the peripheral portions of the semiconductor element since the portion directly under the semiconductor element is completely filled with the cured thermosetting resin and the thermosetting resin does not extend into the outside portions of the semiconductor element.

In the process of the present invention, the process for curing the photocurable resin applied to the peripheral portions of the semiconductor element is not particularly limited. For example, the photocurable resin can be cured by irradiation of the applied photocurable resin with light using a spot light source. The wavelength of the light for the irradiation can be suitably selected in accordance with the type of the photopolymerization initiator comprised in the photocurable resin. Examples of the light include visible light having a wavelength in the range of 400 to 700 nm, ultraviolet light having a wavelength in the range of 300 to 450 and ultraviolet light having a wavelength in the range of 240 to 400 nm enhanced at 250 nm band. It is preferable that the intensity of the light for the irradiation is in the range of 1,000 to 6,000 mW/cm$^2$ and more preferably in the range of 3,000 to 4,000 mW/cm$^2$. When the intensity of the light for the irradiation is smaller than 1,000 mW/cm$^2$, there is the possibility that curing the photocurable resin in a short time becomes difficult. The photocurable resin is rapidly cured at the intensity of the light for the irradiation of 6,000 mW/cm$^2$ or smaller and, in general, an intensity of light exceeding 6,000 mW/cm$^2$ is not necessary.

In accordance with the process of the present invention, the time required for curing the thermosetting resin for bonding the semiconductor element to the circuit board by heating is about the same as the time required for photocuring the photocurable resin applied to the peripheral portions of the semiconductor element. Therefore, the stage of applying the thermosetting resin, the stage of curing the thermosetting resin by heating, the stage of applying the photocurable resin and the stage of photocuring the photocurable resin are disposed in this order in the production line of the semiconductor device, and the semiconductor device can be produced by transferring intermediate products along the production line while the operations in the stage of heat curing and in the stage of photocuring are synchronized. Since apparatuses for the stage of applying the photocurable resin and the stage of photocuring the photocurable resin are small and can be easily added to conventional production lines, the semiconductor device can be produced in accordance with the process of the present invention without major changes in the production line which has been used.

Figure 2:
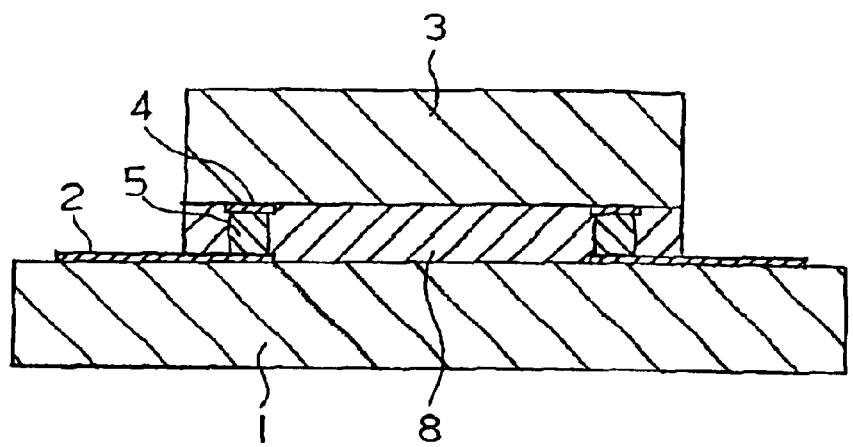
FIG. 2 shows a diagram describing an embodiment of the process for producing a semiconductor device of the present invention.
Figure 3:
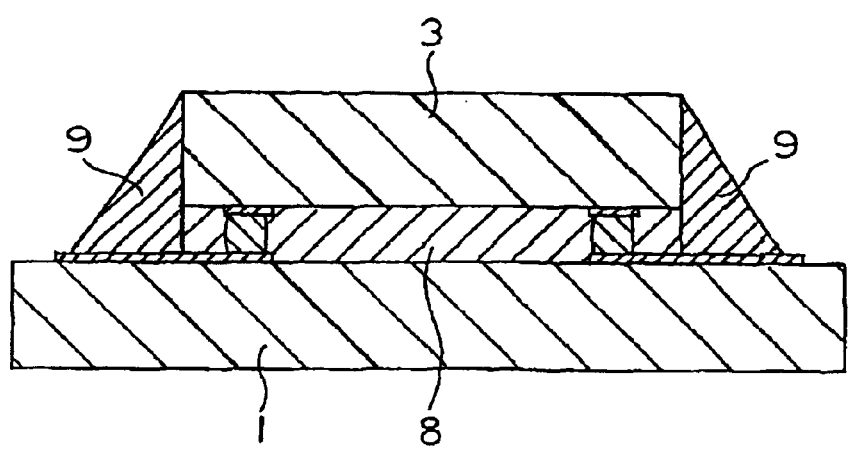
FIG. 3 shows a diagram describing an embodiment of the process for producing a semiconductor device of the present invention.

FIG. 2 and FIG. 3 show diagrams describing an embodiment of the process for producing a semiconductor device of the present invention. As shown in FIG. 2, a circuit board 1 is coated with a thermosetting resin 8. A semiconductor element 3 is placed at a position on the coated thermosetting resin 8 decided in a manner such that electric current can pass between an electrode 2 on the circuit board 1 and an electrode 4 on the semiconductor element 3 via a bump 5. In this condition, the semiconductor element is pressed under heating by a head of a flip chip mounting machine. The thermosetting resin is cured, and the semiconductor element is bonded to the circuit board. The amount of the thermosetting resin is adjusted so that the portion directly under the semiconductor element is exactly filled with the thermosetting resin and the thermosetting resin does not extend into the outside portions of the semiconductor element. Then, as shown in FIG. 3, a photocurable resin 9 is applied to the peripheral portions of the semiconductor element 3 and cured by irradiation with light, and a fillet is formed. Due to the fillet formed in the peripheral portions of the semiconductor element, infiltration of oxygen and water into the thermosetting resin is prevented, and the semiconductor device is protected. The area of bonding between the semiconductor element and the circuit board is increased, and the strength such as the impact strength of the semiconductor device is improved.

The semiconductor device of the present invention is a semiconductor device comprising a semiconductor element mounted to a circuit board in accordance with the flip chip bonding process, wherein the semiconductor element is bonded to the circuit board with a thermosetting resin at portions directly under the semiconductor element, and a fillet is formed with a photocurable resin at peripheral portions of the semiconductor element. In conventional semiconductor devices prepared in accordance with the flip chip bonding process, a thermosetting resin for bonding a semiconductor element to a circuit board is used in a great amount, and a fillet is formed with the thermosetting resin forced out of the portion directly under the semiconductor element. In a semiconductor device prepared in accordance with the flip chip bonding process, an anisotropically conductive adhesive paste or an anisotropically conductive adhesive film are mainly used as the thermosetting resin. By using an anisotropically conductive material as the thermosetting resin, bonding between the semiconductor element and the circuit board, the electric connection of electrodes which are faced to each other and the electric insulation between adjacent electrodes can be achieved simultaneously. However, for the material forming the fillet, it is not necessary that the material is an anisotropically conductive material but it is important that the bonding strength between the semiconductor element and the circuit board is increased, and infiltration of oxygen and water into the inner portions of the semiconductor device is prevented so that resistance to heat and moisture of the semiconductor device is enhanced and reliability of the semiconductor device is improved. When the resin forming the fillet is the same as the thermosetting resin disposed directly under the semiconductor element, it is not always easy that a resin having the most suitable properties for the fillet is selected. In the semiconductor device of the present invention, the thermosetting resin for bonding the semiconductor element to the circuit board and the photocurable resin forming the fillet can be selected independently from each other. Therefore, the resin most suitable for sufficiently satisfying the properties required for the fillet can be selected to form the fillet, and the semiconductor device exhibiting excellent reliability can be obtained.

To summarize the advantages of the present invention, in accordance with the process of the present invention, the semiconductor device exhibiting excellent resistance to heat and moisture and reliability can be efficiently produced in accordance with the flip chip bonding process. The semiconductor device of the present invention exhibits excellent resistance to heat and moisture.

EXAMPLES

The present invention will be described more specifically with reference to examples in the following. However, the present invention is not limited to the examples.

Example 1

Using a substrate prepared by laminating a copper foil having a thickness of 35 $\mu$m to a polyethylene terephthalate film having a width of 16 mm, a length of 45 mm and a thickness of 50 $\mu$m via a urethane adhesive having a thickness of 10 $\mu$m, a coil circuit having a line width of 200 $\mu$m and wound 10 folds was prepared.

On the prepared circuit, an IC for non-contact automatic identification [manufactured by PHILIPS SEMICONDUCTORS; I-code; the size: 1.5 mm×1.5 mm] was mounted by a flip chip mounting machine [manufactured by KYUSHU MATSUSHITA ELECTRIC Co., Ltd.; FB30T-M] using an anisotropically conductive adhesive paste [manufactured by KYOCERA Chemical Corporation; TAP0402E] as the adhesive. The amount of the anisotropically conductive adhesive paste applied to the circuit was controlled based on the area, which was 0.4 mm$^2$. The temperature of heating the anisotropically conductive adhesive paste was adjusted at 220° C. at a position under the chip. The pressure applied to the IC chip was adjusted at 2 N. The mounting was conducted by heating under the pressure for 7 seconds.

To the side faces of the amounted IC, 0.1 g of an acrylic adhesive of the UV curing type [manufactured by NORLAND PRODUCTS, Inc.; NOA88] was added as drops. The side faces of the IC were coated with the acrylic adhesive of the UV curing type, and a fillet was formed. The acrylic adhesive of the UV curing type was cured by irradiation with light for 7 seconds using a UV spot light source [HAMAMATSU PHOTONICS K.K.; LC6], and a transponder circuit was completed.

After it was confirmed that 20 transponder circuits of the sheet form prepared as described above functioned normally using a kit for evaluation of I-code [manufactured by PHILIPS SEMICONDUCTORS; SLEV400], the circuits were placed into a small environment tester [manufactured by ESPEC CORP.; SH-241] and kept under a hot and humid condition of 60° C. and 90% RH for 1,000 hours. After the circuits treated under the hot and humid condition were left standing at the room temperature for 24 hours, it was examined whether the circuits functioned normally, and it was found that none of the 20 circuits showed defective functions.

Example 2

Transponder circuits were prepared in accordance with the same procedures as those conducted in Example 1 except that the fillet was formed by using an epoxy-based adhesive of the UV curing type [manufactured by NORLAND PRODUCTS, Inc.; NEA123L].

After it was confirmed that 20 transponder circuits of the sheet form prepared as described above functioned normally in accordance with the same procedures as those conducted in Example 1, the circuits were placed into a small environment tester and kept under a hot and humid condition of 60° C. and 90% RH for 1,000 hours. After the circuits treated under the hot and humid condition were left standing at the room temperature for 24 hours, it was examined whether the circuits functioned normally, and it was found that none of the 20 circuits showed defective functions.

Comparative Example 1

In accordance with the same procedures as those conducted in Example 1,a coil circuit of a copper foil was formed on the polyethylene terephthalate film, the IC for non-contact automatic identification was mounted on the prepared circuit by the flip chip mounting machine using the anisotropically conductive adhesive paste as the adhesive, and a transponder circuit was prepared.

Twenty transponder of the sheet form prepared as described above were used for the evaluation without forming a fillet with the adhesive of the UV curing type. After it was confirmed that the transponder circuits functioned normally, the circuits were placed into a small environment tester and kept under a hot and humid condition of 60° C. and 90% RH for 1,000 hours. After the circuits treated under the hot and humid condition were left standing at the room temperature for 24 hours, it was examined whether the circuits functioned normally. It was found that 18 out of the 20 circuits showed defective functions.

Comparative Example 2

A transponder circuit was prepared in accordance with the same procedures as those conducted in Example 1 except that a fillet was formed by using 0.1 g of an epoxy-based thermosetting adhesive [manufactured by Three Bond; 2217H] in place of the adhesive of the UV curing type, followed by heating in an oven at 220° C. for 25 seconds. The polyethylene terephthalate film of the substrate shrunk, and the flatness of the circuit was seriously damaged.

In accordance with the same procedures as those conducted in Example 1, after it was confirmed that 20 transponder circuits of the sheet form prepared as described above functioned normally, the circuits were placed into a small environment tester and kept under a hot and humid condition of 60° C. and 90% RH for 1,000 hours. After the circuits treated under the hot and humid condition were left standing at the room temperature for 24 hours, it was examined whether the circuits functioned normally. It was found that none of the 20 circuits showed defective functions.

Comparative Example 3

A transponder circuit was prepared in accordance with the same procedures as those conducted in Example 1 except that a fillet was formed by using 0.1 g of an epoxy-based thermosetting adhesive [manufactured by Three Bond; 2223] in place of the adhesive of the UV curing type, followed by heating in an oven at 150° C. for 25 seconds.

In accordance with the same procedures as those conducted in Example 1,after it was confirmed that 20 transponder circuits of the sheet form prepared as described above functioned normally, the circuits were placed into a small environment tester and kept under a hot and humid condition of 60° C. and 90% RH for 1,000 hours. After the circuits treated under the hot and humid condition were left standing at the room temperature for 24 hours, it was examined whether the circuits functioned normally. It was found that 15 out of the 20 circuits showed defective functions.

The result of Examples 1 and 2 and Comparative Example 1 to 3 are shown in Table 1.

TABLE 1

| | Adhesive for forming fillet | Condition of curing | Number of defects after treatment under hot and humid condition | Note |
| --- | --- | --- | --- | --- |
| Example 1 | acrylic adhesive of UV curing type | irradiation with UV for 7 sec | 0 | — |
| Example 2 | epoxy-based adhesive of UV curing type | irradiation with UV for 7 sec | 0 | — |
| Comparative Example 1 | none | — | 18 | — |
| Comparative Example 2 | epoxy-based thermosetting adhesive | heating at 220° C. for 25 sec | 0 | shrinkage of substrate poor appearance |
| Comparative Example 3 | epoxy-based thermosetting adhesive | heating at 150° C. for 25 sec | 15 | — |

In Examples 1 and 2 in which the fillet was formed with the acrylic adhesive of the UV curing type or the epoxy-based adhesive of the UV curing type, the adhesive was cured by irradiation with the ultraviolet light for 7 seconds, and the fillet exhibiting excellent resistance to heat and moisture was formed. The time of heating under the pressure for curing the anisotropically conductive adhesive paste for bonding the semiconductor element to the circuit board was also 7 seconds. Therefore, when the stage of applying the adhesive of the UV curing type and the stage of curing the UV curable adhesive were disposed after the stage of applying the anisotropically conductive adhesive paste and the stage of curing the adhesive paste in the production line of the semiconductor device, the curing time of the anisotropically conductive adhesive paste and the curing time of the adhesive of the UV curing type can be synchronized, and the bonding of the semiconductor element with the anisotropically conductive adhesive paste and the formation of the fillet with the adhesive of the UV curing type could be achieved simultaneously without a decrease in the productivity of the semiconductor device.

In the device of Comparative Example 1 in which no fillet was formed, the resistance to heat and moisture was poor. As shown in Comparative Example 2 and 3,it takes 25 seconds for the curing by heating when the epoxy-based thermosetting adhesive was used, and a decrease in the productivity was inevitable. The semiconductor device of Comparative Example 2 which was prepared by heating at 220° C. showed poor appearance due to shrinkage of the substrate although the resistance to heat and moisture was excellent. The semiconductor device of Comparative Example 3 which was prepared by heating at 150° C. showed poor resistance to heat and moisture although the appearance showed no defects.

What is claimed is:

1. A process for producing a semiconductor device in a process comprising mounting a semiconductor element in accordance with bonding process, the process comprising:

applying a thermosetting resin on a surface of a circuit board to fill the portion directly under said semiconductor element in an amount such that the portion directly under said semiconductor element is completely filled with said thermosetting resin and said thermosetting resin does not substantially extend into the outside portions of the semiconductor element, bonding the semiconductor element to a circuit board by pressing the semiconductor element into the thermosetting resin, curing said thermosetting resin by heating for a time required for curing said thermosetting resin for bonding said semiconductor element to said circuit board, applying a photocurable resin to peripheral portions of the bonded semiconductor element to coat said peripheral portions, and curing said photocurable resin by irradiation of light for a time required for curing said photocurable resin to form a fillet.

2. A process according to claim 1, wherein the time required for curing the thermosetting resin for bonding the semiconductor element to said circuit board is about the same as the time required for curing said photocurable resin to form a fillet.

3. A process according to claim 2, wherein the time required for curing the thermosetting resin and the time required for curing the photocurable resin are 10 second or less.

4. A process according to claim 2, wherein the semiconductor device is produced by transferring intermediate products along a production line, in said production line, a stage of applying the thermosetting resin, a stage of curing the thermosetting resin by heating, a stage of applying the photocurable resin and a stage of photocuring the photocurable resin being disposed in this order, and wherein the operations in the stage of heat curing and in the stage of photocuring are synchronized.

5. A process according to claim 3, wherein the semiconductor device is produced by transferring intermediate products along a production line, in said production line a stage of applying the thermosetting resin, a stage of curing the thermosetting resin by heating, a stage of applying the photocurable resin and a stage of photocuring the photocurable resin being disposed in this order, and wherein the operations in the stage of heat curing and in the stage of photocuring are synchronized.

6. A process according to claim 1, wherein the thermosetting resin is an anisotropically conductive adhesive.

7. A process according to claim 6, wherein the step of applying of the anisotropically conductive adhesive comprises applying any one selected from the group consisting of anisotropically conductive adhesive paste and anisotropically conductive adhesive film.

8. A process according to claim 7, wherein the anisotropically conductive adhesive paste or the anisotropically conductive adhesive film comprises a thermosetting resin selected from the group consisting of epoxy resins, polyimide resins and urethane acrylate resins and conductive particles selected from the group consisting of particles of nickel, silver and gold, and particles of resins plated with aforesaid metals.

9. A process according to claim 8, wherein the semiconductor device is produced by transferring intermediate products along a production line in said production line, a stage of applying the thermosetting resin, a stage of curing the thermosetting resin by heating, a stage of applying the photocurable resin and a stage of photocuring the photocurable resin being disposed in this order, and wherein the operations in the stage of heat curing and in the stage of photocuring are synchronized.

10. A process according to claim 9, wherein the photocurable resin comprises a polymerizable prepolymer for radical polymerization selected from the group consisting of a urethane (meth)acrylate, a polyester (meth)acrylate, a polyether (meth)acrylate, an epoxy (meth)acrylate and a poly(meth)acrylic ester having a carbon-carbon double bond on the side chains.

11. A process according to claim 9, wherein the photocurable resin comprises a polymerizable prepolymer for cationic polymerization selected from the group consisting of polyether glycidyls, polyester glycidyls, cyclic aliphatic epoxy resins, heterocyclic epoxy resins, epoxy resins of the novolak type, epoxy resins of the bisphenol A type, epoxy resins of the bisphenol AD type, poly(meth)acrylic esters having glycidyl group on the side chains.

12. A process according to claim 1, wherein the photocurable resin comprises a polymerizable prepolymer for radical polymerization selected from the group consisting of a urethane (meth)acrylate, a polyester (meth)acrylate, a polyether (meth)acrylate, an epoxy (meth)acrylate and a poly(meth)acrylic ester having a carbon-carbon double bond on the side chains.

13. A process according to claim 1, wherein the photocurable resin comprises a polymerizable prepolymer for cationic polymerization selected from the group consisting of polyether glycidyls, polyester glycidyls, cyclic aliphatic epoxy resins, heterocyclic epoxy resins, epoxy resins of the novolak type, epoxy resins of the bisphenol A type, epoxy resins of the bisphenol AD type, poly(meth)acrylic esters having glycidyl group on the side chains.

* * * * *